United States Patent
Zuehlsdorff et al.

(10) Patent No.: US 9,945,919 B2
(45) Date of Patent: Apr. 17, 2018

(54) SYSTEMS AND METHODS FOR REAL TIME GRADIENT TIMING MODIFICATION

(71) Applicant: Siemens Healthcare GmbH, Erlangen (DE)

(72) Inventors: Sven Zuehlsdorff, Westmont, IL (US); Haris Saybasili, Chicago, IL (US); Lars Lauer, Neunkirchen (DE); David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 529 days.

(21) Appl. No.: 14/510,254

(22) Filed: Oct. 9, 2014

(65) Prior Publication Data

US 2016/0103195 A1 Apr. 14, 2016

(51) Int. Cl.
*G01R 33/54* (2006.01)
*G01R 33/565* (2006.01)

(52) U.S. Cl.
CPC ...... *G01R 33/543* (2013.01); *G01R 33/56572* (2013.01)

(58) Field of Classification Search
CPC ............ G01R 33/5617; G01R 33/4835; G01R 33/34833; G01R 33/5615; G01R 33/543; G01R 33/288; G01R 33/385; G01R 33/3854; G01R 33/3804; A61B 5/055
See application file for complete search history.

(56) References Cited

U.S. PATENT DOCUMENTS

| 6,198,289 B1 * | 3/2001 | Du | G01R 33/385 324/307 |
|---|---|---|---|
| 8,228,060 B2 * | 7/2012 | Busse | A61B 5/055 324/307 |
| 2010/0308829 A1 * | 12/2010 | Vu | G01R 33/288 324/314 |
| 2012/0194185 A1 * | 8/2012 | Ritter | G01R 33/4836 324/309 |

(Continued)

OTHER PUBLICATIONS

Simonelli, et al., An Optimal Design Method for Magnetic Resonance Imaging Gradient Waveforms. IEEE Transactions on Medical Imaging, vol. 12, No. 2, Jun. 1993, pp. 350-360.

(Continued)

*Primary Examiner* — Clayton E Laballe
*Assistant Examiner* — Ruifeng Pu

(57) ABSTRACT

A method is provided for modified gradient timing in a Magnetic Resonance (MR) imaging system. The method includes generating radio frequency (RF) excitation pulses in a volume of patient anatomy to provide subsequent acquisition of associated RF echo data and generating a sequence of gradient waveforms on a static magnetic field in three directions each orthogonal to each other for slice selection, phase encoding and readout RF data acquisition in the volume of patient anatomy. The method also includes receiving, by a controller, an indication of the sequence of gradient waveforms to be applied to a plurality of gradient coils and modifying, via the controller, the sequence of gradient waveforms to be applied to the plurality of gradient coils based on one or more parameters to produce a sequence (Continued)

of modified gradient waveforms. The method further includes providing the sequence of modified gradient waveforms to the plurality of gradient coils.

12 Claims, 6 Drawing Sheets

(56) References Cited

U.S. PATENT DOCUMENTS

| | | | | |
|---|---|---|---|---|
| 2014/0091795 A1* | 4/2014 | Grodzki | ............... | G01R 33/543 324/309 |
| 2014/0111200 A1* | 4/2014 | Grodzki | ............ | G01R 33/4833 324/309 |
| 2014/0232396 A1* | 8/2014 | Grodzki | ............... | G01R 33/543 324/309 |
| 2015/0042333 A1* | 2/2015 | Grodzki | ............... | G01R 33/543 324/309 |
| 2015/0097566 A1* | 4/2015 | Grodzki | ............... | G01R 33/288 324/322 |
| 2015/0108975 A1* | 4/2015 | Grodzki | ............ | G01R 33/5617 324/309 |
| 2015/0204953 A1* | 7/2015 | Ookawa | ............... | G01R 33/543 324/309 |
| 2015/0241536 A1* | 8/2015 | Grodzki | ............... | G01R 33/543 324/309 |
| 2015/0268322 A1* | 9/2015 | Paul | ....................... | G01R 33/34 324/309 |
| 2015/0285878 A1* | 10/2015 | Gonen | ................. | G01R 33/485 324/309 |
| 2015/0285885 A1* | 10/2015 | Feiweier | ............... | G01R 33/288 324/309 |
| 2015/0293197 A1* | 10/2015 | Taniguchi | ............ | G01R 33/543 324/309 |
| 2016/0131731 A1* | 5/2016 | Oka | ....................... | A61B 5/055 324/309 |
| 2017/0023655 A1* | 1/2017 | Grodzki | ............. | G01R 33/3804 |

OTHER PUBLICATIONS

Derbyshire, et al., Efficient Implementation of Hardware-Optimized Gradient Sequences for Real-Time Imaging, Magn Reson Med. Dec. 2010; 64(6): 1814-1820.

Drobnjak, et al., Optimizing gradient waveforms for microstructure sensitivity in diffusionweighted MR, Journal of Magnetic Resonance (2010), doi: 10.1016/j.jmr.2010.05.017, pp. 1-40.

Lustig, et al., A Fast Method for Designing Time-Optimal Gradient Waveforms for Arbitrary k-Space Trajectories, IEEE Trans Med Imaging, Jun. 2008; 27(6): 866-873.

Siemens Brochure, Quiet Suite, Imaging is to be seen, not heard, www.siemens.com/quiet-suite, 8 pages, Nov. 2013.

\* cited by examiner

SYSTEMS AND METHODS FOR REAL TIME GRADIENT TIMING MODIFICATION

TECHNOLOGY FIELD

The present application relates generally to methods, systems, and apparatuses for real time gradient timing modification in Magnetic Resonance (MR) imaging, and in particular, to methods, systems, and apparatuses for real time gradient timing modification in MR imaging sequences using boundary conditions.

BACKGROUND

MR imaging is a medical imaging technique that uses an applied static magnetic field ($B_0$) and radio frequency (RF) pulses to generate images (e.g., via slices) of organs and structures inside the body. During MR imaging, the static magnetic field causes magnetic moment vectors of protons (typically in hydrogen atoms of water molecules) to align with the static magnetic field. The RF pulses cause the magnetic moment vectors of the protons to be displaced (e.g., rotate) relative to the magnetic field and re-align with the magnetic field. A MR imaging scanner picks up magnetic signals from the protons in the body that result from magnetization moment vectors re-aligning with and rotating around the static magnetic field. The signals may then be converted into images based on the location and strength of the incoming signals.

MR imaging uses sequences of the RF pulses and the magnetic gradient fields to spatially encode the MR signal of a signal carrier such as tissue in a patient. An MR imaging sequence may be separated in sections that are associated with three orthogonal spatial dimensions. A slice selection direction defines a two dimensional plane or slice of excitation. The phase encoding and readout (frequency) encoding direction define the remaining two directions of the plane.

Conventional sequence design methods and systems use dedicated timing of gradient pulses and tissue dependent physiological parameters as contrast parameters. For example, tissue specific parameters serving as contrast parameters include longitudinal or transversal relaxation parameters (T1, T2), blood flow, diffusion or even oxygenation level of blood. The corresponding sequences may exhibit sophisticated and carefully adjusted timing of RF and gradient pulses. Although MR imaging sequence design methods and systems exist, there is a continuing need for more and different sequence design methods and systems.

SUMMARY

Embodiments provide a method for modified gradient timing in a Magnetic Resonance (MR) imaging system. The method includes generating radio frequency (RF) excitation pulses in a volume of patient anatomy to provide subsequent acquisition of associated RF echo data and generating a sequence of gradient waveforms on a static magnetic field in three directions each orthogonal to each other for slice selection, phase encoding and readout RF data acquisition in the volume of patient anatomy. The method also includes receiving, by a controller, an indication of the sequence of gradient waveforms to be applied to a plurality of gradient coils and modifying, via the controller, the sequence of gradient waveforms to be applied to the plurality of gradient coils based on one or more parameters to produce a sequence of modified gradient waveforms. The method further includes providing the sequence of modified gradient waveforms to the plurality of gradient coils.

According to one embodiment, modifying the sequence of gradient waveforms further includes selecting limits, selecting optimization criteria based on the selected limits and selecting an algorithm based on the selected optimization criteria.

According to another embodiment, selecting limits further comprises selecting from hardware limits of system components and waveform limits.

In one embodiment, selecting limits further includes selecting from slew rate limits of gradients, maximum gradient strength, duty cycle, waveform templates, radiofrequency power limits and physiological limitations of a system component.

In another embodiment, selecting optimization criteria further includes selecting from minimizing a slew rate, maximizing a slew rate; minimizing waveform moments, maximize waveform moments, minimizing gradient strength and maximizing gradient strength.

According to an aspect of an embodiment, selecting optimization criteria further includes selecting from: (i) preventing modification of the one or more parameters; (ii) providing modification of the one or more parameters within a range; and (iii) providing modification of the parameter within the selected limits.

In another aspect of an embodiment, selecting an algorithm further includes selecting from: (i) gradient waveform optimization as a discrete problem with imposed linear constraint functions; (ii) optimization of a gradient waveform at hardware limits of a system component independent of slice orientation with decreased repetition time (TR) for certain slice orientations; (iii) shape optimization of a gradient to maximize diffusion sensitivity; and (iv) time-optimized arbitrary k-space trajectories under constraints of gradient slew rate and amplitude characteristics.

According to one embodiment, modifying the sequence of gradient waveforms further includes determining which of the one or more parameters is used to produce the sequence of modified gradient waveforms based on at least one of: (i) characteristics of the sequence of gradient waveforms; (ii) specifications of system components and (ii) characteristics of the modified waveform.

According to another embodiment, modifying the sequence of gradient waveforms further includes selecting from: (i) maximizing slew rate and gradient strength to reduce repetition time (TR); (ii) reducing slew rates to reduce potential peripheral nerve stimulation; and (iii) eliminating edges and realizing a smooth gradient waveform.

Embodiments provide a magnetic resonance (MR) imaging system for modifying gradient timing. The system includes a radio frequency (RF) signal generator configured to generate RF excitation pulses in patient anatomy and enabling subsequent acquisition of associated RF echo data and a magnetic field gradient generator that includes a plurality of gradient coils configured to generate a sequence of gradient waveforms on a static magnetic field in three directions each orthogonal to each other for slice selection, phase encoding and readout RF data acquisition in the volume of patient anatomy. The system also includes a controller configured to: (i) receive an indication of the sequence of gradient waveforms to be applied to a plurality of gradient coils; and (ii) modify the sequence of gradient waveforms based on one or more parameters to produce a sequence of modified gradient waveforms. The system further includes a plurality of gradient coils configured to acquire the sequence of modified gradient waveforms provided by the controller.

According to one embodiment, the controller is further configured to modify the sequence of gradient waveforms by selecting limits, selecting optimization criteria based on the selected limits and selecting an algorithm based on the selected optimization criteria.

According to another embodiment, the controller is further configured to select limits from hardware limits of system components and waveform limits.

In one embodiment, the controller is further configured to select limits from slew rate limits of gradients, maximum gradient strength, duty cycle, waveform templates, radiofrequency power limits and physiological limitations of a system component.

In another embodiment, the controller is further configured to select optimization criteria from minimizing a slew rate, maximizing a slew rate; minimizing waveform moments, maximize waveform moments, minimizing gradient strength and maximizing gradient strength.

In another embodiment, the controller is further configured to select optimization criteria from: (i) preventing modification of the one or more parameters; (ii) providing modification of the one or more parameters within a range; and (iii) providing modification of the parameter within the selected limits.

Embodiments provide an article of manufacture for modifying gradient timing in a magnetic resonance (MR) imaging system, the article of manufacture comprising a non-transitory, tangible computer-readable medium holding computer-executable instructions for performing a method that includes generating radio frequency (RF) excitation pulses in a volume of patient anatomy to provide subsequent acquisition of associated RF echo data and generating a sequence of gradient waveforms on a static magnetic field in three directions each orthogonal to each other for slice selection, phase encoding and readout RF data acquisition in the volume of patient anatomy. The method also includes receiving, by a controller, an indication of the sequence of gradient waveforms to be applied to a plurality of gradient coils and modifying, via the controller, the sequence of gradient waveforms to be applied to the plurality of gradient coils based on one or more parameters to produce a sequence of modified gradient waveforms. The method further includes providing the sequence of modified gradient waveforms to the plurality of gradient coils.

According to one embodiment, modifying the sequence of gradient waveforms further includes selecting limits, selecting optimization criteria based on the selected limits and selecting an algorithm based on the selected optimization criteria.

According to another embodiment, selecting limits further includes selecting from slew rate limits of gradients, maximum gradient strength, duty cycle, waveform templates, radiofrequency power limits and physiological limitations of a system component.

In one embodiment, selecting optimization criteria further includes selecting from minimizing a slew rate, maximizing a slew rate; minimizing waveform moments, maximize waveform moments, minimizing gradient strength and maximizing gradient strength.

In another embodiment, selecting optimization criteria further includes selecting from: (i) preventing modification of the one or more parameters; (ii) providing modification of the one or more parameters within a range; and (iii) providing modification of the parameter within the selected limits.

Additional features and advantages of this disclosure will be made apparent from the following detailed description of illustrative embodiments that proceeds with reference to the accompanying drawings.

BRIEF DESCRIPTION OF THE DRAWINGS

The foregoing and other aspects of the embodiments disclosed herein are best understood from the following detailed description when read in connection with the accompanying drawings. For the purpose of illustrating the embodiments disclosed herein, there is shown in the drawings embodiments that are presently preferred, it being understood, however, that the embodiments disclosed herein are not limited to the specific instrumentalities disclosed. Included in the drawings are the following Figures.

DETAILED DESCRIPTION OF EXEMPLARY EMBODIMENTS

Conventional MRI sequences are applied in three orthogonal directions: a slice selection direction; a readout or frequency encode direction; and a phase encode direction as the gradient pulses are typically separable. The combination of the gradient pulses may, however, result in fairly complex gradient pulse shapes (gradient waveform). These shapes typically exhibit fast changing gradients and peaks of high gradient fields. Further, an MR imaging scanner may execute the gradients in a physical gradient system defined by the design of the coils that generate magnetic gradient fields in the x direction, y and z direction. The transformation from a logical gradient system to physical gradient system may be represented by a rotation and translation in three dimensions. The gradient waveforms in the x direction, the y direction and the z direction are linear combinations of the gradient waveforms in slice selection direction, readout encode direction and phase encode direction. As a result, the gradient activity in the physical directions may become irregular. These irregular patterns may cause excessive noise of the scanner and exceed physical limits of gradient coils and amplifiers. The irregular patterns may also affect image quality (e.g., by increased eddy currents).

Embodiments disclosed herein provide systems and methods that modify a sequence of gradient waveforms to be provided to the amplifiers and gradient coils and provide the modified sequence of gradient waveforms to the amplifiers and gradient coils based on one or more parameters. In some embodiments, the one or more parameters may include categories of parameterization, such as hard limits (e.g., hardware limitations), optimization criteria (e.g. minimize the slew rate of the final gradient waveform) and algorithms. Embodiments disclosed herein provide images produced from a modified sequence of gradient waveforms that include significant reduction in gradient noise values without compromising image quality.

Figure 1:
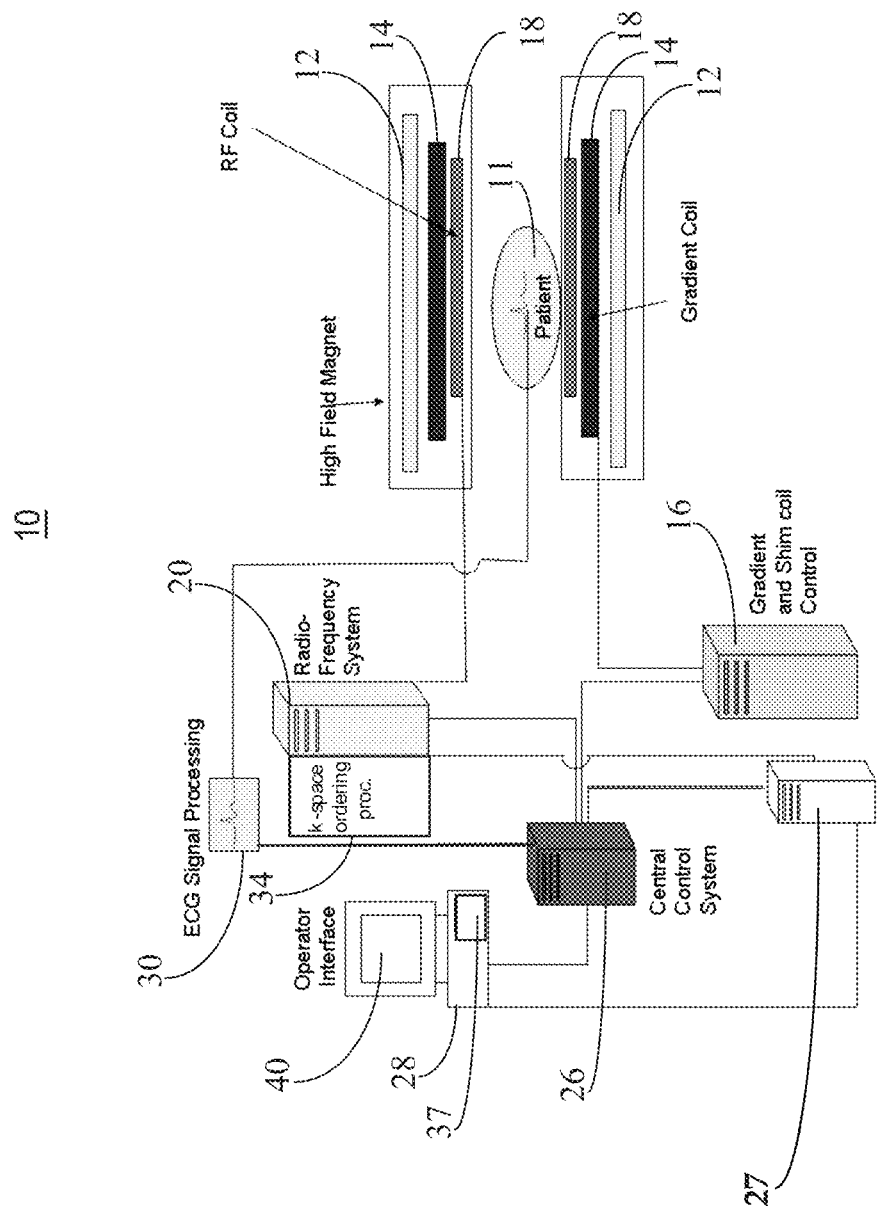
FIG. 1 is a system block diagram illustrating a system for modified gradient timing in a Magnetic Resonance (MR) imaging system, for use with embodiments disclosed herein.

FIG. 1 is a system block diagram illustrating a system 10 for real time gradient timing optimization. As shown at FIG. 1, system 10 includes a magnet 12 configured to create a static magnetic field in the body of patient 11 to be imaged and positioned on a table. System 10 also includes a plurality of coils 14 that include gradient coils and shimming coils configured to produce position dependent magnetic field gradients superimposed on the static magnetic field. The gradient coils are configured to generate linear slice select magnetic field gradients on a static magnetic field. The coils 14, in response to gradient signals supplied thereto by a gradient and shimming and pulse sequence control module 16, produce position dependent and shimmed magnetic field gradients in three orthogonal directions and generate magnetic field pulse sequences. The shimming coils are configured to generate non-linear magnetic field gradients on the static magnetic field to modify the homogeneity of the static magnetic field. That is, the shimmed gradients compensate for non-homogeneity and variability in an MR imaging device magnetic field resulting from patient anatomical variation and other sources. The magnetic field gradients include a slice-selection gradient magnetic field, a phase encoding gradient magnetic field and a readout gradient magnetic field that are applied to patient 11.

Further, Radio Frequency (RF) module 20 provides RF pulse signals to coils 18, which in response produce magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16, in conjunction with RF module 20 as directed by central control unit 26, control slice-selection, phase encoding, readout gradient magnetic fields, radio frequency transmission, and magnetic resonance signal detection to acquire magnetic resonance signals representing planar slices of patient 11.

In response to applied RF pulse signals, the coils 18 receive MR signals. For example, coils 18 may receive signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. In some embodiments, the image data processor (e.g., image data processor 27) may be external to the central control unit 26. ECG synchronization signal generator 30 provides ECG signals used for pulse sequence and imaging synchronization. A two or three dimensional k-space storage array of individual data elements in unit 34 stores corresponding individual frequency components comprising a MR dataset.

A RF signal generator comprising module 20 and coils 18 generates RF excitation pulses in anatomy of patient 11 and enables subsequent acquisition of associated RF echo data. A magnetic field gradient generator (comprising magnetic coils 12 and 14) generates a magnetic field for use in acquiring multiple individual frequency components and generates magnetic field gradients for anatomical slice selection, phase encoding and readout RF data acquisition in a three dimensional (3D) anatomical volume. The RF signal generator units 18 and 20 and the magnetic field gradient generator units 12 and 14 provide a rotating frame preparation pulse sequence comprising at least one of: (a) a T1 spin lattice relaxation in a rotating frame (T1ρ) preparation pulse sequence of adiabatic pulses comprising modulated RF pulses and modulated magnetic field gradients for slice selection; and (b) a T2 spin-spin relaxation in a rotating frame (T2ρ) preparation pulse sequence of adiabatic pulses comprising modulated RF pulses and modulated magnetic field gradients for slice selection.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data, as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 2:
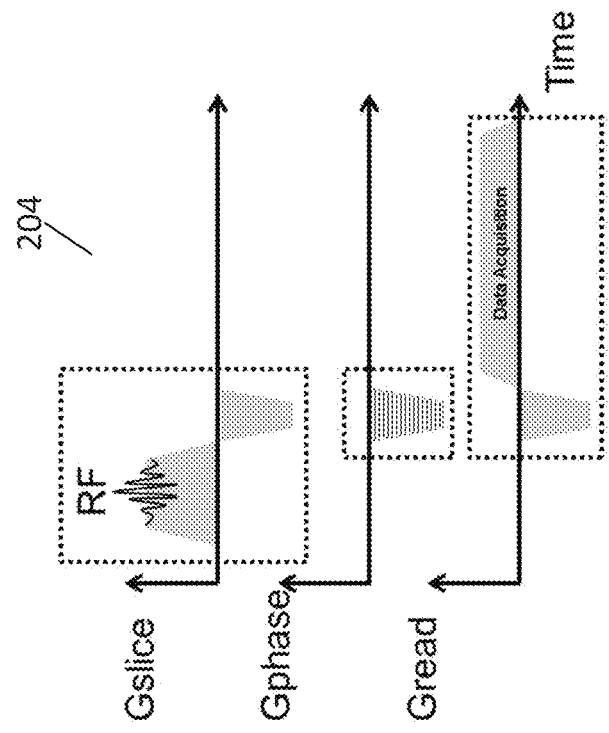
FIG. 2 is an illustration showing three sections (Gslice, Gphase and Gread) of an exemplary MR imaging sequence applied to three corresponding orthogonal spatial dimensions of an imaging plane that may be implemented within embodiments disclosed herein.
Figure 2:
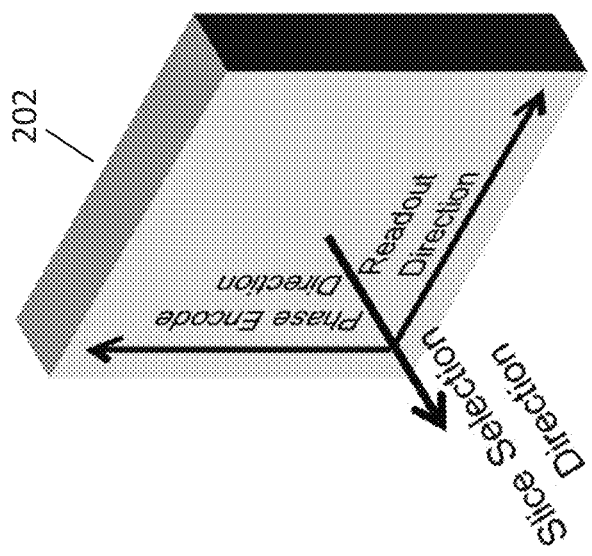

FIG. 2 is an illustration showing three sections (Gslice, Gphase and Gread) of an exemplary MR imaging sequence applied to three corresponding orthogonal spatial dimensions of an imaging plane that may be implemented within embodiments disclosed herein.

As shown in FIG. 2, an imaging plane 202 may be defined by the slice selection direction, the readout (frequency encode) direction and the phase encode direction. An MRI sequence 204 may excite the plane 202 by applying a magnetic field gradient in a slice encoding direction (Gslice) and an RF pulse. A magnetic field gradient may then be applied in a phase encode direction (Gphase) that induces phase variation along this axis. A magnetic field gradient may then be applied in the readout (Gread) direction and the MRI signal may be detected. The gradient waveform sequence may be repeated with different phase encoding gradient strengths to spatially encode the MR imaging signal.

Figure 3:
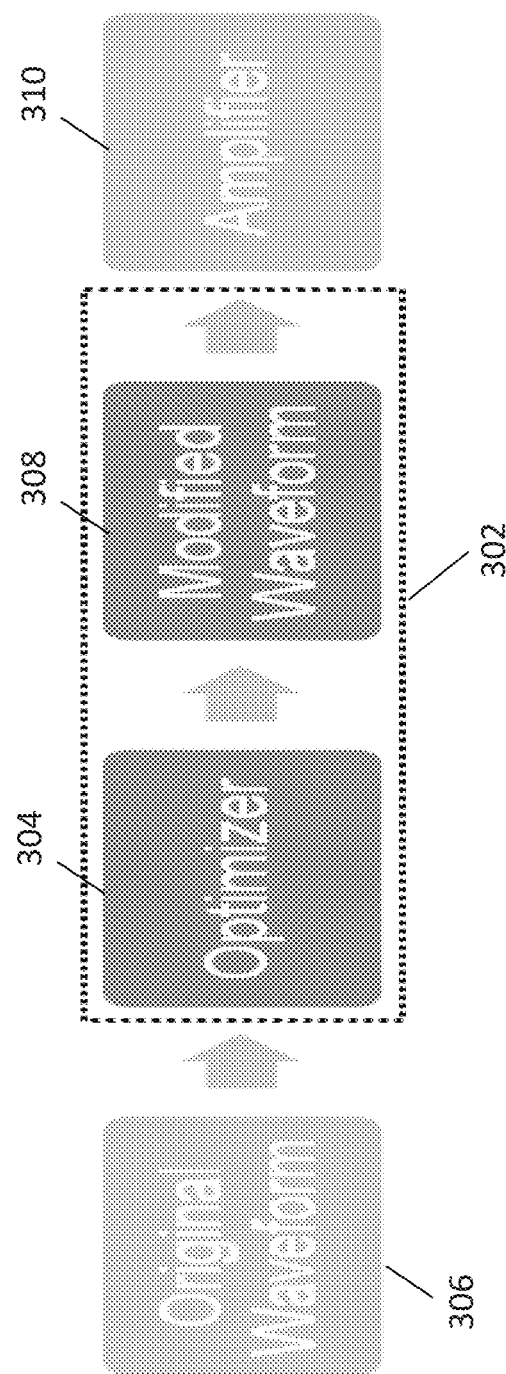
FIG. 3 is a system flow diagram illustrating an exemplary system for modifying gradient waveforms according to embodiments disclosed herein.

FIG. 3 is a system flow diagram illustrating an exemplary system for modifying gradient waveforms according to embodiments disclosed herein. As shown in FIG. 3, the system, (e.g., system 10 shown in FIG. 1), may include a controller 302. In some embodiments, the controller 302 may be part of gradient and shim controller 16 shown in FIG. 1. In some embodiments, the controller 302 may be part of central control system 26 shown in FIG. 1. In other embodiments, the controller 302 may be separate from both gradient and shim controller 16 and the central control system 26.

An exemplary method for modifying gradient timing in an MR imaging system 10 is now described with reference to FIG. 3. The exemplary method may include generating radio frequency (RF) excitation pulses in a volume of patient anatomy to provide subsequent acquisition of associated RF echo data. The method may also include generating a sequence of gradient waveforms (original waveform) 306 on a static magnetic field in three directions, as described above, each orthogonal to each other for slice selection, phase encoding and readout RF data acquisition in the volume of patient anatomy.

As shown in the embodiment at FIG. 3, controller 302 may include an optimizer 304. Optimizer 304 may be a software module having programmable instructions to control or modify the original waveform 306. In some embodiments, optimizer 304 may be part of controller 302. In other embodiments, optimizer 304 may be separate from controller 302. Controller 302 may be configured to receive an indication of the sequence of gradient waveforms (original waveform) 306 to be applied to amplifier 310 and coils 18 in the x direction, the y direction and the z direction. The original waveform 306 may be calculated as a linear combination of the waveforms in logical directions (e.g., slice selection, phase encode direction and readout direction). Controller 302 may then modify the original waveform 306 to produce a modified waveform 308 using a dedicated and configurable set of boundary conditions. The modified waveform 308 may then be amplified by amplifier 310 and acquired by coils 18 shown in FIG. 1.

In some embodiments, controller 302 may be configured to provide different modifications of the original waveform 308 based on a plurality of input parameters (e.g., characteristics of the original waveform and specifications of system components) and output parameters (e.g., ranges or thresholds of noise gradients of modified image). The controller 302 may determine which of the one or more parameters may be used to modify the original waveform 306 based on characteristics of the original waveform 306 and/or desired characteristics of the modified waveform 308. In one embodiment, the controller 302 may select a single parameter from a group of selectable parameters. In another embodiment, the controller 302 may select a plurality of parameters from a group of selectable parameters.

Figure 4:
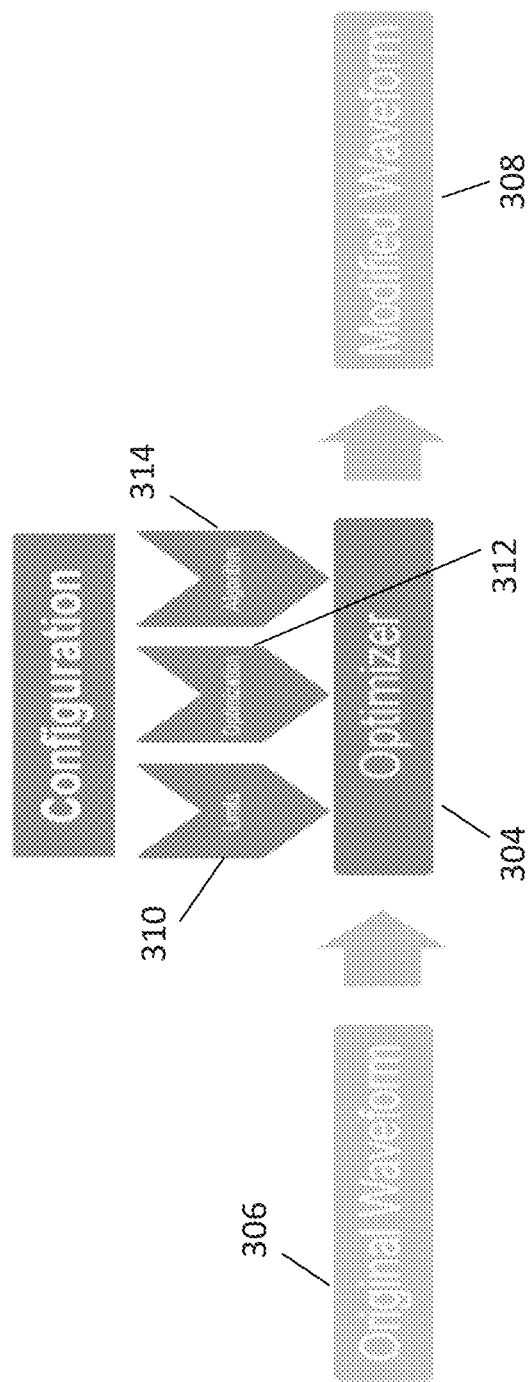
FIG. 4 is a system flow diagram illustrating different categories of parameterization used by the optimizer to modify the original waveform according to embodiments disclosed herein.

FIG. 4 is a system flow diagram illustrating different categories of parameterization used by the optimizer to modify the original waveform 306 according to embodiments disclosed herein. As shown in FIG. 4, the different categories of parameterization may include a limits category 310, an optimization criteria category 312 and an optimization algorithm selection category 314. The categories may be performed sequentially. For example, limits 310, such as hardware limits, may be defined. The optimization criteria 312 may then be input. The underlying optimizing algorithm 314 may then be defined and configured. Table 1 below illustrates these different categories of parameterization and examples of each category.

TABLE 1

| Limits | Optimization | Algorithm |
| --- | --- | --- |
| Hardware limits | Optimization criteria | Selection of algorithm |
| Hard waveform limits | Soft waveform limits | Parameterization of algorithm |

Hardware limits may include gradient system limits (e.g., slew rate of gradients, maximal gradient strength, duty cycle and available waveform templates) and radiofrequency power limits (e.g., duty cycle and minimal duration of pulse). Hard waveform limits may include physiological limitations or parameters that may not be exceeded during operation of a scanner, such as limiting gradient slew rates to avoid peripheral nerve stimulation or specific absorption rate (SAR) below limits defined by regulatory bodies such as the Food and Drug Administration (FDA).

Optimization criteria may be defined that is a result of a specific goal that the optimization algorithm attempts to accomplish. Table 2 below illustrates examples of selected optimization strategies and possible goals of the optimization.

TABLE 2

| Optimization Criteria | Goal |
| --- | --- |
| Minimize slew rate | Reduce noise of scan |
| Maximize slew rate | Reduce scan time/repetition time |
| Minimize waveform moments | Reduce motion induced waveform |
| Maximize waveform moments | Increase diffusion sensitivity |
| Maximize gradient strength | Reduce repetition time (TR) |
| Minimize gradient strength | Reduce power consumption of gradients |

Defining specific optimization criteria may be determined by a plurality of factors, such as conflicting boundary conditions. For example, increasing spatial resolution of images may include increasing scan time or decreasing the signal-to-noise ratio (SNR). MRI exhibits a wealth of imaging parameters that may be correlated with each other.

Table 3 below illustrates types of optimization parameters and soft limits for each type of optimization parameter. For example, during the optimization process, soft waveform limits may exist for each imaging parameter that may not permit modification of a parameter, permit modification in a range or permit free modification as shown below in Table 3.

TABLE 3

| Optimization Parameter Type | Waveform Limits |
| --- | --- |
| Fixed | Optimization cannot modify parameter |
| Range | Optimization is allowed to modify parameter within a range |
| Free | Optimization is allow to modify parameter within hardware limits |

For some sequences, the echo time (TE) may exclude modification of TE from an optimization. In other sequences, TE may be modified to satisfy an optimization criterion. Gradient waveform parameters that may be modified during an optimization process may include, but are not limited to gradient slew rates, gradient amplitude, gradient shape (e.g., trapezoid and sinusoidal), echo time (TE), repetition time (TR), inversion, saturation time (TI), gradient moments, diffusion weighting and duty cycle. A parameter may be weighted or considered differently depending on the type of optimization parameter.

An optimization algorithm may be selected based on one or more factors, such as for example: (i) gradient waveform optimization as a discrete problem with imposed linear constraint functions; (ii) optimization of a gradient waveform at hardware limits of a device (e.g., scanner) independent of slice orientation with decreased repetition time (TR) for certain slice orientations; (iii) shape optimization of a gradient to maximize diffusion sensitivity; and (iv) time-optimized arbitrary k-space trajectories under constraints of gradient slew rate and amplitude characteristics.

Figure 5:
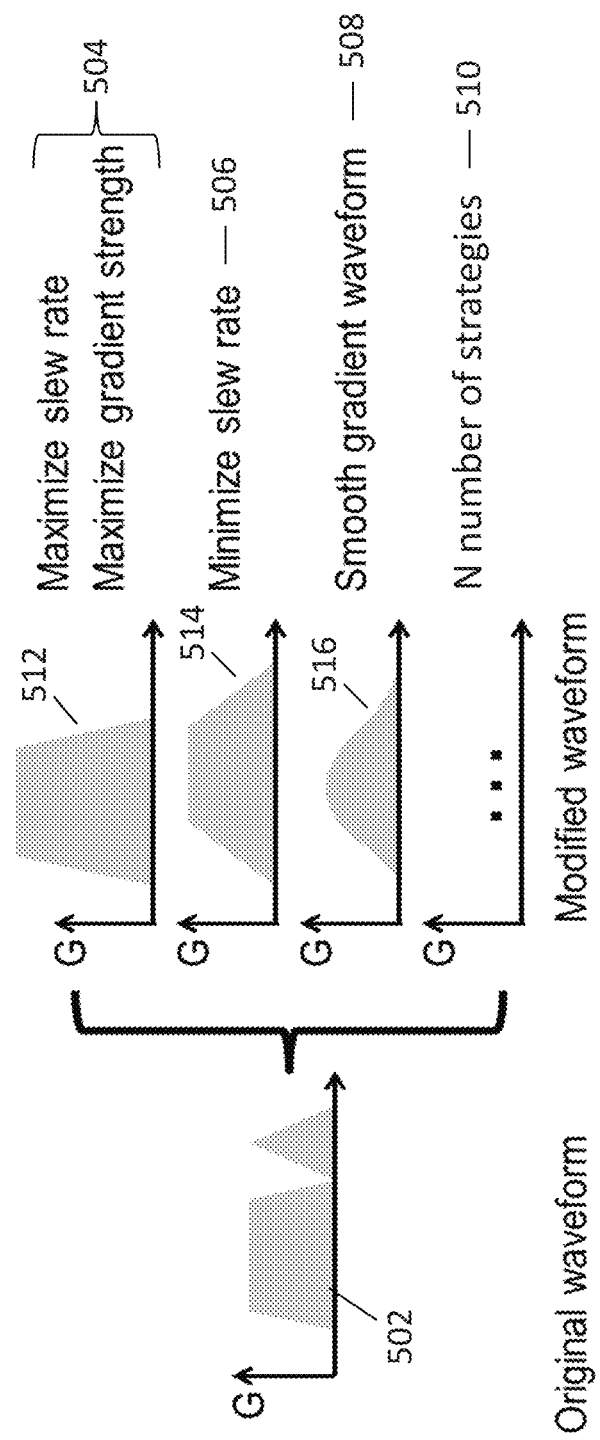
FIG. 5 is an illustration showing examples of optimization strategies used to modify an exemplary gradient waveform having two trapezoidal lobes that may be implemented within embodiments disclosed herein.

FIG. 5 is an illustration showing examples of optimization strategies used to modify an exemplary gradient waveform 502 having two trapezoidal lobes that may be implemented within embodiments disclosed herein. The gradient waveform 502 represents a common scenario in MRI sequence design. As shown in the example in FIG. 5, the original waveform 502 may be modified using optimization strategies such as: (i) reducing repetition time (TR) by maximizing both slew rate and gradient strength (within hard ware limits) to 504 to provide the modified waveform 512; (ii) reducing potential peripheral nerve stimulation by reducing slew rates 506 to provide the modified waveform 514; and/or eliminating edges and realizing a smooth gradient waveform to reduce gradient noise 508 to provide the modified waveform 516. As indicated by the ellipses in FIG. 4, any number N of optimization strategies may be used to modify the exemplary gradient waveform 502.

A resulting image produced from a modified sequence (e.g., turbo spin echo (TSE) sequence) of gradient waveforms (using one or more optimization strategies) may include a gradient noise value that is significantly reduced from a gradient noise value in an unmodified image produced from an unmodified sequence of gradient waveforms. For example, in one embodiment, a resulting image produced from a modified sequence of gradient waveforms using minimized slew rates may include a gradient noise value of 78 dB(A) that is reduced from a gradient noise value of 91 dB(A) in an unmodified image produced from an unmodified sequence of gradient waveforms. Further, the reduction in noise may be provided without compromising image quality by maintaining other imaging parameters. This value of reduced gradient noise (13 dB(A)), however, is merely exemplary. Embodiments may cause any amount of reduced gradient noise values in images depending on a number of factors, such as the value of gradient noise provided by the unmodified waveform and the categories of parameterization used to modify the waveform.

Figure 6:
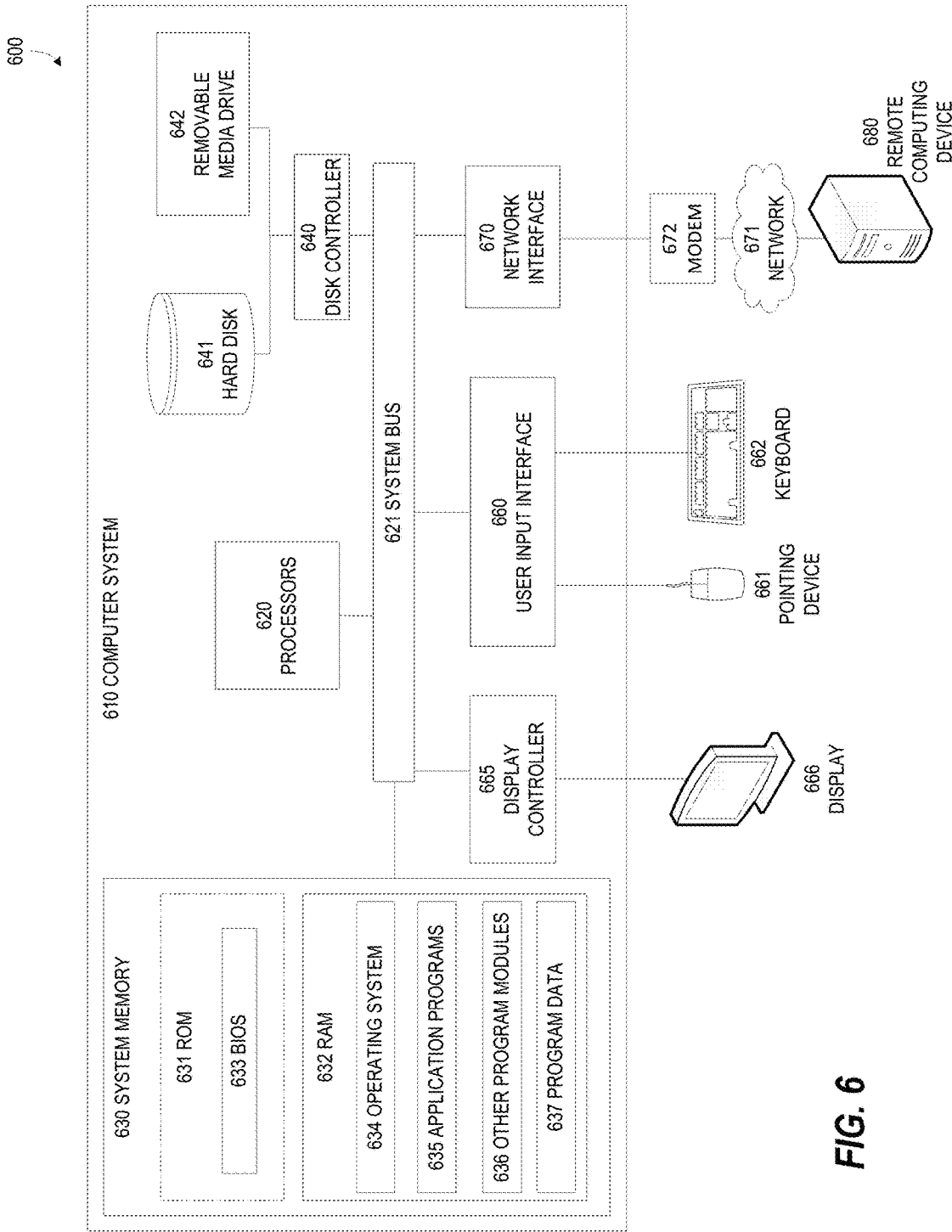
FIG. 6 illustrates an example of a computing environment within which embodiments may be implemented.

FIG. 6 illustrates an example of a computing environment 600 within which embodiments may be implemented. Computing environment 600 may include computer system 610, which is one example of a computing system upon which embodiments may be implemented. As shown in FIG. 6, the computer system 610 may include a communication mechanism such as a bus 621 or other communication mechanism for communicating information within the computer system 610. The system 610 further includes one or more processors 620 coupled with the bus 621 for processing the information. The processors 620 may include one or more CPUs, GPUs, or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a magnetic hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display or monitor 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments and for containing data structures, tables, records, or other data described herein. The term "computer readable medium" as used herein refers to any non-transitory, tangible medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer 610. When used in a networking environment, computer 610 may include modem 672 for establishing communications over a network 671, such as the Internet. Modem 672 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing system 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The GUI also includes an executable procedure or executable application. The executable procedure or executable application conditions the display processor to generate signals representing the GUI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the GUI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of the figures presented herein are not exclusive. Other systems, processes and menus may be derived in accordance with the principles of embodiments to accomplish the same objectives. Although embodiments have been described with reference to particular embodiments, it is to be understood that the embodiments and variations shown and described herein are for illustration purposes only. Modifications to the current design may be implemented by those skilled in the art, without departing from the scope of embodiments. Further, the processes and applications may, in alternative embodiments, be located on one or more (e.g., distributed) processing devices on a network linking the units of FIG. 6. Any of the functions and steps provided in the Figures may be implemented in hardware, software or a combination of both. No claim element herein is to be construed under the provisions of 35 U.S.C. 112, sixth paragraph, unless the element is expressly recited using the phrase "means for."

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

Embodiments are not limited to those disclosed. Those skilled in the art will appreciate that numerous changes and modifications may be made to the preferred embodiments disclosed herein and that such changes and modifications may be made without departing from the true spirit of the embodiments disclosed herein. It is therefore intended that the appended claims be construed to cover all such equivalent variations as fall within the true spirit and scope of the embodiments disclosed herein.

The invention claimed is:

1. A method for modified gradient timing in a Magnetic Resonance (MR) imaging system, the method comprising:
generating radio frequency (RF) excitation pulses in a volume of patient anatomy to provide subsequent acquisition of associated RF echo data;
generating a sequence of gradient waveforms on a static magnetic field in three directions each orthogonal to each other for slice selection, phase encoding and readout RF data acquisition in the volume of patient anatomy;
receiving, by a controller, an indication of the sequence of gradient waveforms to be applied to a plurality of gradient coils;
selecting limits comprising hardware limits of system components and waveform limits;
setting one or more optimization criteria based on the limits, wherein the optimization criteria comprises plurality of optimization parameters and, for each optimization parameter, an indication of whether the optimization parameter (i) cannot be modified during optimization; (ii) can be modified during optimization within a range of values; or (ii) can be modified during optimization within the hardware limits of the system;

selecting an optimization algorithm from a plurality of optimization algorithms based on the optimization criteria;

modifying, via the controller, the sequence of gradient waveforms to be applied to the plurality of gradient coils using the selected optimization algorithm;

calculating a sequence of modified gradient waveforms; and providing the sequence of modified gradient waveforms to the plurality of gradient coils.

2. The method according to claim 1, wherein selecting limits further comprises selecting from slew rate limits of gradients, maximum gradient strength, duty cycle, waveform templates, radiofrequency power limits and physiological limitations of a system component.

3. The method according to claim 1, wherein modifying the sequence of gradient waveforms further comprises selecting from minimizing a slew rate, maximizing a slew rate; minimizing waveform moments, maximize waveform moments, minimizing gradient strength and maximizing gradient strength.

4. The method according to claim 1, wherein selecting an optimization algorithm further comprises selecting from: (i) gradient waveform optimization as a discrete problem with imposed linear constraint functions; (ii) optimization of a gradient waveform at hardware limits of a system component independent of slice orientation with decreased repetition time (TR) for certain slice orientations; (iii) shape optimization of a gradient to maximize diffusion sensitivity; and (iv) time-optimized arbitrary k-space trajectories under constraints of gradient slew rate and amplitude characteristics.

5. The method according to claim 1, wherein modifying the sequence of gradient waveforms further comprises determining which of the one or more optimization criteria is used to produce the sequence of modified gradient waveforms based on at least one of: (i) characteristics of the sequence of gradient waveforms; (ii) specifications of system components and (ii) characteristics of the modified waveform.

6. The method according to claim 1, wherein modifying the sequence of gradient waveforms further comprises selecting from: (i) maximizing slew rate and gradient strength to reduce repetition time (TR); (ii) reducing slew rates to reduce potential peripheral nerve stimulation; and (iii) eliminating edges and realizing a smooth gradient waveform.

7. A magnetic resonance (MR) imaging system for modifing gradient timing, comprising:

a radio frequency (RF) signal generator configured to generate RF excitation pulses in patient anatomy and enabling subsequent acquisition of associated RF echo data;

a magnetic field gradient generator comprising a plurality of gradient coils configured to generate a sequence of gradient waveforms on a static magnetic field in three directions each orthogonal to each other for slice selection, phase encoding and readout RF data acquisition in the volume of patient anatomy;

a controller configured to:
receive an indication of the sequence of gradient waveforms to be applied to a plurality of gradient coils;
select limits comprising hardware limits of system components and waveform limits;
set one or more optimization criteria based on the limits, wherein the optimization criteria comprises plurality of optimization parameters and, for each optimization parameter, an indication of whether the optimization parameter (i) cannot be modified during optimization; (ii) can be modified during optimization within a range of values; or (ii) can be modified during optimization within the hardware limits of the system;
select an optimization algorithm from a plurality of optimization algorithms based on the optimization criteria; and
modify the sequence of gradient waveforms using the optimization algorithm to calculate a sequence of modified gradient waveforms; and a plurality of gradient coils configured to acquire the sequence of modified gradient waveforms provided by the controller.

8. The imaging system according to claim 7, wherein the controller is further configured to select limits from slew rate limits of gradients, maximum gradient strength, duty cycle, waveform templates, radiofrequency power limits and physiological limitations of a system component.

9. The imaging system according to claim 7, wherein the controller is further configured to modify the sequence of gradient waveforms from minimizing a slew rate, maximizing a slew rate; minimizing waveform moments, maximize waveform moments, minimizing gradient strength and maximizing gradient strength.

10. An article of manufacture for modifying gradient timing in a magnetic resonance (MR) imaging system, the article of manufacture comprising a non-transitory, tangible computer-readable medium holding computer-executable instructions for performing a method comprising:

generating radio frequency (RF) excitation pulses in a volume of patient anatomy to provide subsequent acquisition of associated RF echo data;

generating a sequence of gradient waveforms on a static magnetic field in three directions each orthogonal to each other for slice selection, phase encoding and readout RF data acquisition in the volume of patient anatomy;

receiving, by a controller, an indication of the sequence of gradient waveforms to be applied to a plurality of gradient coils;

selecting limits comprising hardware limits of system components and waveform limits;

setting one or more optimization criteria based on the limits, wherein the optimization criteria comprises plurality of optimization parameters and, for each optimization parameter, an indication of whether the optimization parameter (i) cannot be modified during optimization; (ii) can be modified during optimization within a range of values; or (ii) can be modified during optimization within the hardware limits of the system;

selecting an optimization algorithm from a plurality of optimization algorithms based on the optimization criteria;

modifying, via the controller, the sequence of gradient waveforms to be applied to the plurality of gradient coils using the optimization algorithm;

calculating a sequence of modified gradient waveforms; and providing the sequence of modified gradient waveforms to the plurality of gradient coils.

11. The article of manufacture of claim 10, wherein selecting limits further comprises selecting from slew rate limits of gradients, maximum gradient strength, duty cycle, waveform templates, radiofrequency power limits and physiological limitations of a system component.

12. The article of manufacture of claim 10, wherein modifying the sequence of gradient waveforms further comprises selecting from minimizing a slew rate, maximizing a slew rate; minimizing waveform moments, maximize waveform moments, minimizing gradient strength and maximizing gradient strength.

* * * * *